United States Patent
Chen et al.

(10) Patent No.: US 9,954,495 B1
(45) Date of Patent: Apr. 24, 2018

(54) PVT INVARIANT PEAKING STAGE FOR CONTINUOUS TIME LINEAR EQUALIZER

(71) Applicant: SYNAPTICS INCORPORATED, San Jose, CA (US)

(72) Inventors: Yonggang Chen, Shenzhen (CN); Sagar Kumar, Fremont, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 15/332,830

(22) Filed: Oct. 24, 2016

(51) Int. Cl.
    *H03F 3/45* (2006.01)
    *H03F 1/30* (2006.01)
    *H03F 3/195* (2006.01)
    *H04L 25/03* (2006.01)

(52) U.S. Cl.
    CPC ............... *H03F 1/30* (2013.01); *H03F 3/195* (2013.01); *H04L 25/03057* (2013.01); *H03F 2200/447* (2013.01); *H03F 2200/552* (2013.01)

(58) Field of Classification Search
    CPC ........................................................ H03F 3/45
    USPC .................................. 330/254, 252
    See application file for complete search history.

(56) References Cited

U.S. PATENT DOCUMENTS

| | | |
|---|---|---|
| 5,283,483 A | 2/1994 | Laber et al. |
| 5,508,570 A | 4/1996 | Laber et al. |
| 5,559,470 A | 9/1996 | Laber et al. |
| 6,462,623 B1 * | 10/2002 | Horan .................. H03K 3/0231 327/270 |
| 7,869,494 B2 | 1/2011 | Hollis |
| 8,384,465 B2 * | 2/2013 | Zanchi .................. H03F 1/3211 327/116 |
| 8,643,432 B1 | 2/2014 | Chan et al. |
| 8,704,583 B2 | 4/2014 | Bulzacchelli et al. |
| 8,964,825 B2 | 2/2015 | Beukema et al. |
| 9,425,999 B1 | 8/2016 | Kumar |
| 9,577,575 B2 * | 2/2017 | Lee ....................... H03K 3/0322 |
| 2008/0236295 A1 * | 10/2008 | Hsieh ........................ G01F 1/28 73/861.08 |
| 2009/0302888 A1 * | 12/2009 | Shumarayev ....... H03F 3/45197 326/62 |
| 2013/0141164 A1 * | 6/2013 | Ichikura .............. H03F 3/45076 330/253 |

* cited by examiner

*Primary Examiner* — Henry Choe
(74) *Attorney, Agent, or Firm* — Paradice and Li LLP

(57) ABSTRACT

Frequency characteristics of a peaking stage can vary depending on variations in the process used to fabricate the peaking stage. For example, depending on the batch of wafers and where on a wafer the peaking stage is formed, the capacitors and resistors may have different values, thereby changing the frequency characteristics of the peaking stage. The embodiments herein describe a peaking stage that is invariant of the process variation. That is, one or more of the frequency characteristics of the peaking stages do not vary as the values of a capacitor or resistor change. As such, peaking stages formed in different process corners on the wafer have the same frequency characteristics, and thus, function in a similar manner.

20 Claims, 7 Drawing Sheets

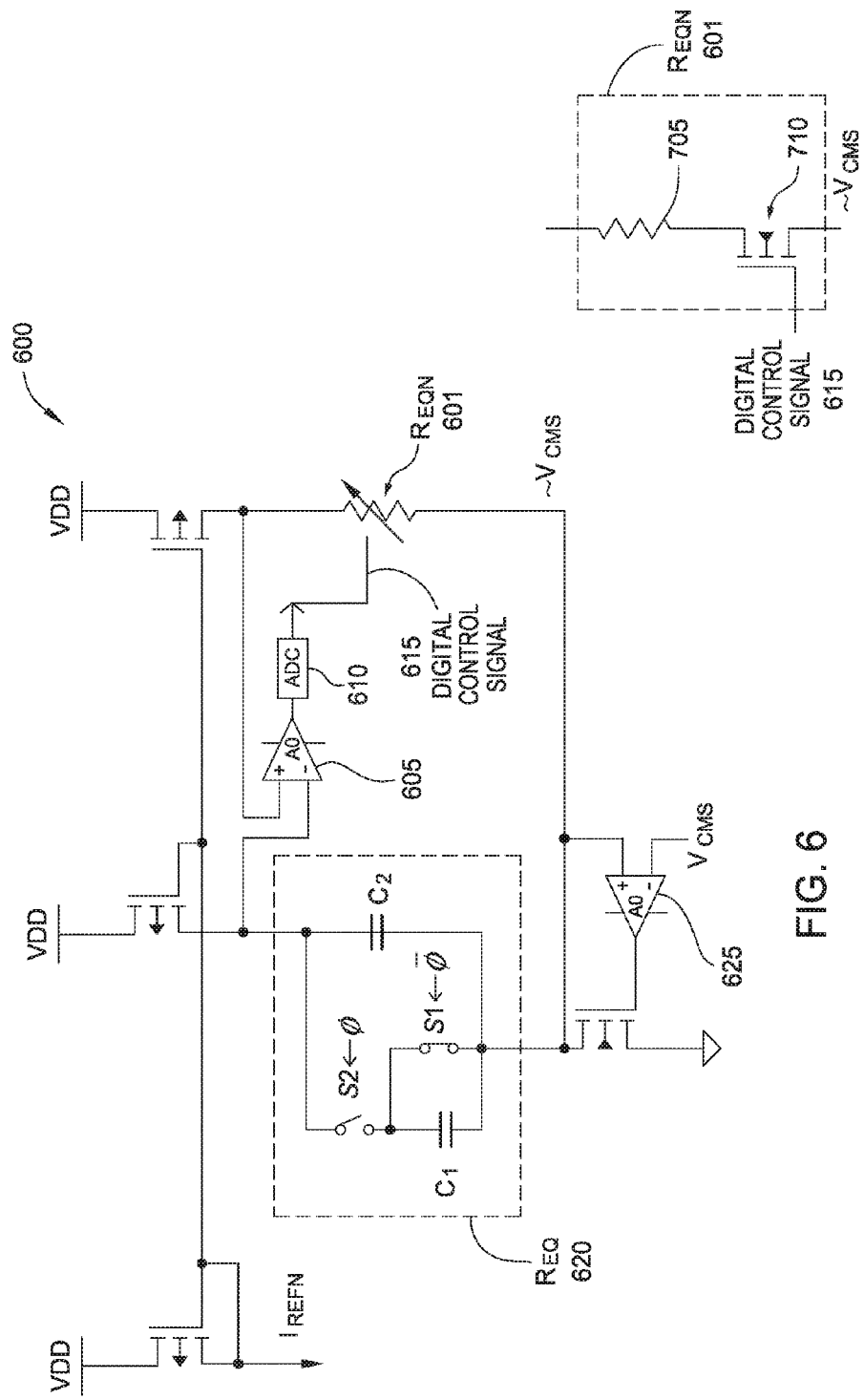

PVT INVARIANT PEAKING STAGE FOR CONTINUOUS TIME LINEAR EQUALIZER

FIELD OF THE INVENTION

This invention generally relates to electronic devices and equalizing power distribution using a peaking stage in an amplifier.

BACKGROUND OF THE INVENTION

Peaking amplifiers are used in electronic systems where a peaking characteristic in a frequency transfer function is needed (e.g., higher gain at high frequencies than at low frequencies). One important application for peaking amplifiers is signal equalization. For instance, when high-speed (e.g., multi-Gb/s) digital data streams are transferred over electrical serial links, the transmitted pulses are distorted by high-frequency losses in the channel media. To improve the maximum data rates of such links, it is preferred to equalize the frequency response of the channel so that the pulse distortion is reduced. For this reason, the receivers of modern high-speed data communication links commonly employ peaking amplifiers, which boost the high-frequency components of the received signal that were attenuated by the channel response.

BRIEF SUMMARY OF THE INVENTION

One embodiment described herein is a peaking stage that includes a first variable resistance comprising a first end coupled to a voltage rail, a second variable resistance comprising a first end coupled to the voltage rail, and a resistance control circuit comprising a first comparator and a first analog to digital converter (ADC) configured to generate a first digital signal for setting a first resistance value of the first variable resistance and a second resistance value of the second variable resistance. The peaking stage also includes a first transistor coupled to a second end of the first variable resistance and a second transistor coupled to a second end of the second variable resistance, where the first and second transistors are configured to generate equalized output signals based on respective input signals.

Another embodiment described herein is an amplifier that includes a peaking stage. The peaking stage includes a first variable resistance comprising a first end coupled to a voltage rail, a second variable resistance comprising a first end coupled to the voltage rail, and a first resistance control circuit comprising a first comparator configured to generate a first signal for setting a first resistance value of the first variable resistance and a second resistance value of the second variable resistance. The peaking stage also includes a first transistor coupled to a second end of the first variable resistance and a second transistor coupled to a second end of the second variable resistance, where the first and second transistors are configured to generate equalized output signals based on respective input signals received by the amplifier.

Another embodiment described herein is an integrated circuit that includes a peaking stage. The peaking stage includes a first variable resistance comprising a first end coupled to a voltage rail, a second variable resistance comprising a first end coupled to the voltage rail, and a resistance control circuit comprising a comparator configured to generate a first signal for setting a first resistance value of the first variable resistance and a second resistance value of the second variable resistance. The peaking stage includes a first transistor coupled to a second end of the first variable resistance and a second transistor coupled to a second end of the second variable resistance, wherein the first and second transistors are configured to generate equalized output signals based on respective input signals received by the amplifier.

BRIEF DESCRIPTION OF DRAWINGS

FIG. 6 illustrates a degeneration resistance control generator in accordance with an embodiment described herein.

FIG. 7 illustrates a variable resistor for the degeneration resistance control generator in accordance with an embodiment described herein.

Figure 1:
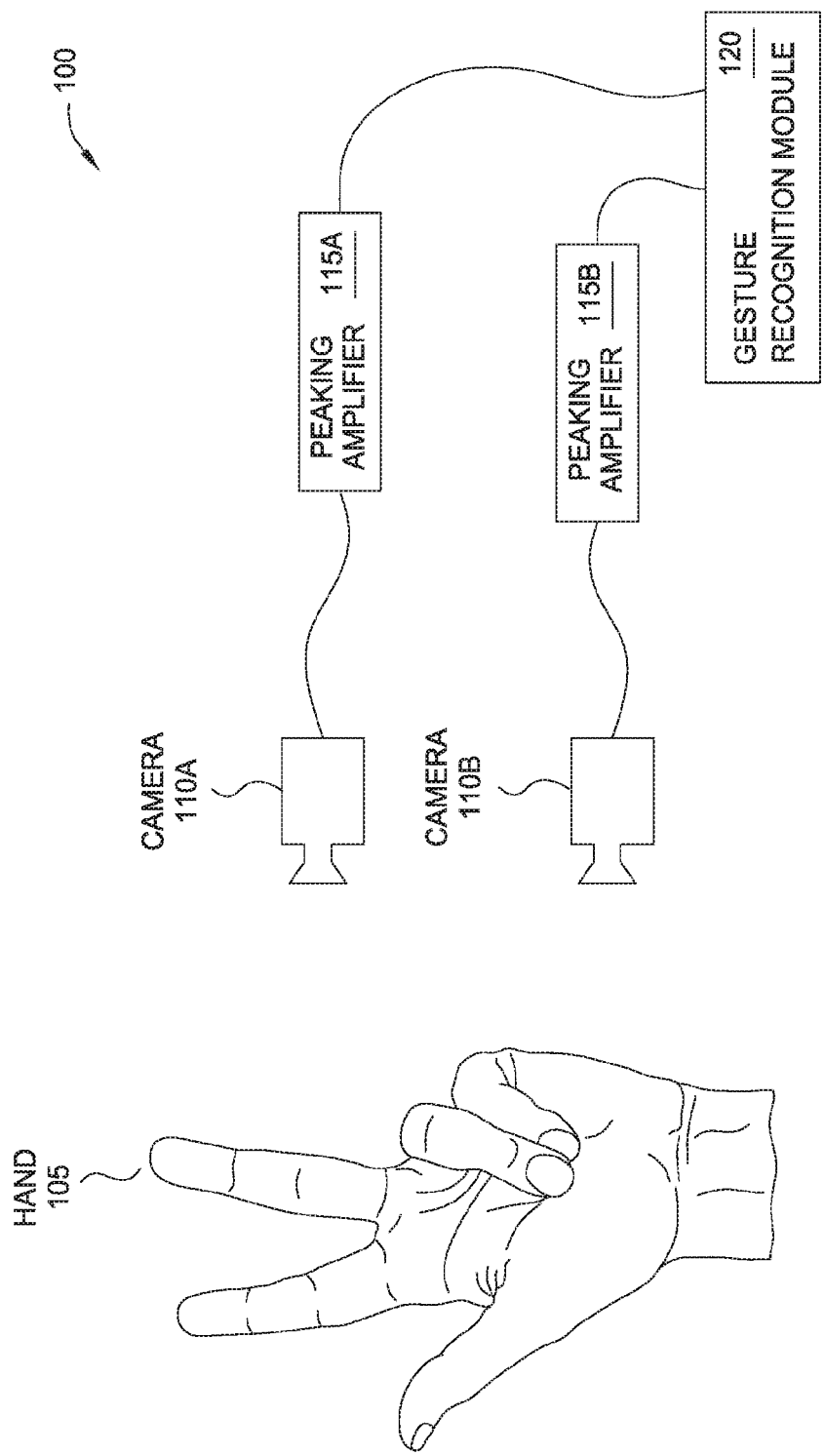
FIG. 1 illustrates a system that includes peaking amplifiers, in accordance with an embodiment described herein.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the disclosure or its application and uses. Furthermore, there is no intention to be bound by any expressed or implied theory presented in the preceding technical field, background, brief summary or the following detailed description.

Various embodiments of the present invention provide input devices and methods that facilitate improved usability. Some signals in the input device may have power distributed across multiple frequencies or bands. However, the power may not be distributed equally across the frequencies—e.g., a lower frequency may have more power than a higher frequency. To equalize the power distribution, an amplifier may include a peaking stage which has a gain that varies across a frequency band. Thus, the peaking stage can adjust the signals so that the power distribution between frequencies is similar.

Frequency characteristics of the peaking stage, however, can vary depending on variations in the process used to fabricate the peaking stage. For example, the peaking stage may be formed in an integrated circuit and include different capacitive elements and poly resistors which affect the frequency characteristics of the peaking stage. Depending on where on a wafer the peaking stage is formed, the capacitive elements and resistors may have different values, thereby changing the frequency characteristics of the peaking stage. Thus, the gain of the peaking stages formed on the wafer may vary depending on where the peaking stages were formed.

The embodiments herein describe a peaking stage that is invariant of the process variation. That is, one or more of the frequency characteristics of the peaking stages do not vary as the values of a capacitive element or resistor change. As such, peaking stages formed in different process corners on the wafer have the same frequency characteristics, and thus, function in a similar manner. In one embodiment, the peaking stage includes a variable resistance that is controlled by resistance control circuit that includes a comparator and an analog-to-digital converter (ADC) which generate a digital control signal that adjusts the resistance value of the variable resistance. As a result, even as the values of the physical capacitive elements and resistors change relative to other peaking circuits formed on the same wafer, each peaking stage can compensate for this process variation by adjusting the resistance value of the variable resistance thereby maintaining the desired frequency characteristics.

FIG. 1 illustrates a system 100 that includes peaking amplifiers 115, in accordance with an embodiment described herein. Specifically, the system 100 includes cameras 110 coupled to the peaking amplifiers 115 which in turn provide equalized signals to a gesture recognition module 120. In one embodiment, the peaking amplifiers 115 and the gesture recognition module 120 are disposed on an integrated circuit—e.g., a system on chip (SOC). The SOC can be coupled to the high-speed video cameras 110 via connection cables. In operation, the cameras 110 capture high-definition images of gestures or motion made by a hand 105 of a user which typical requires a high bandwidth. For example, the data speed at which the data captured by the cameras 110 is transmitted to the gesture recognition module 120 may be between 1-10 GHz.

The channel insertion loss of the high speed data signals transmitted by the cameras 110 means that the signals received by the gesture recognition module 120 are difficult to recover. For example, the channel insertion loss may result in poor power distribution among the frequencies in the high speed data signals—i.e., the signals are not equalized. Instead, the high speed signals are transmitted to respective peaking amplifiers 115 which equalize the power distribution of the signals which make the signals easier to recover at the gesture recognition module 120.

After receiving the signals, the gesture recognition module 120 processes the data to identify different gestures of the hand 105. Because two cameras 110 are used, the module 120 can identify gestures in 3-D motion capture rather than just 2-D. In one embodiment, the system 100 is used in an augmented reality or virtual reality application. However, the peaking amplifiers 115 described herein are not limited to a system that performs gesture recognition, and instead, may be used in any system where data signals have poor power distribution.

Figure 2A:
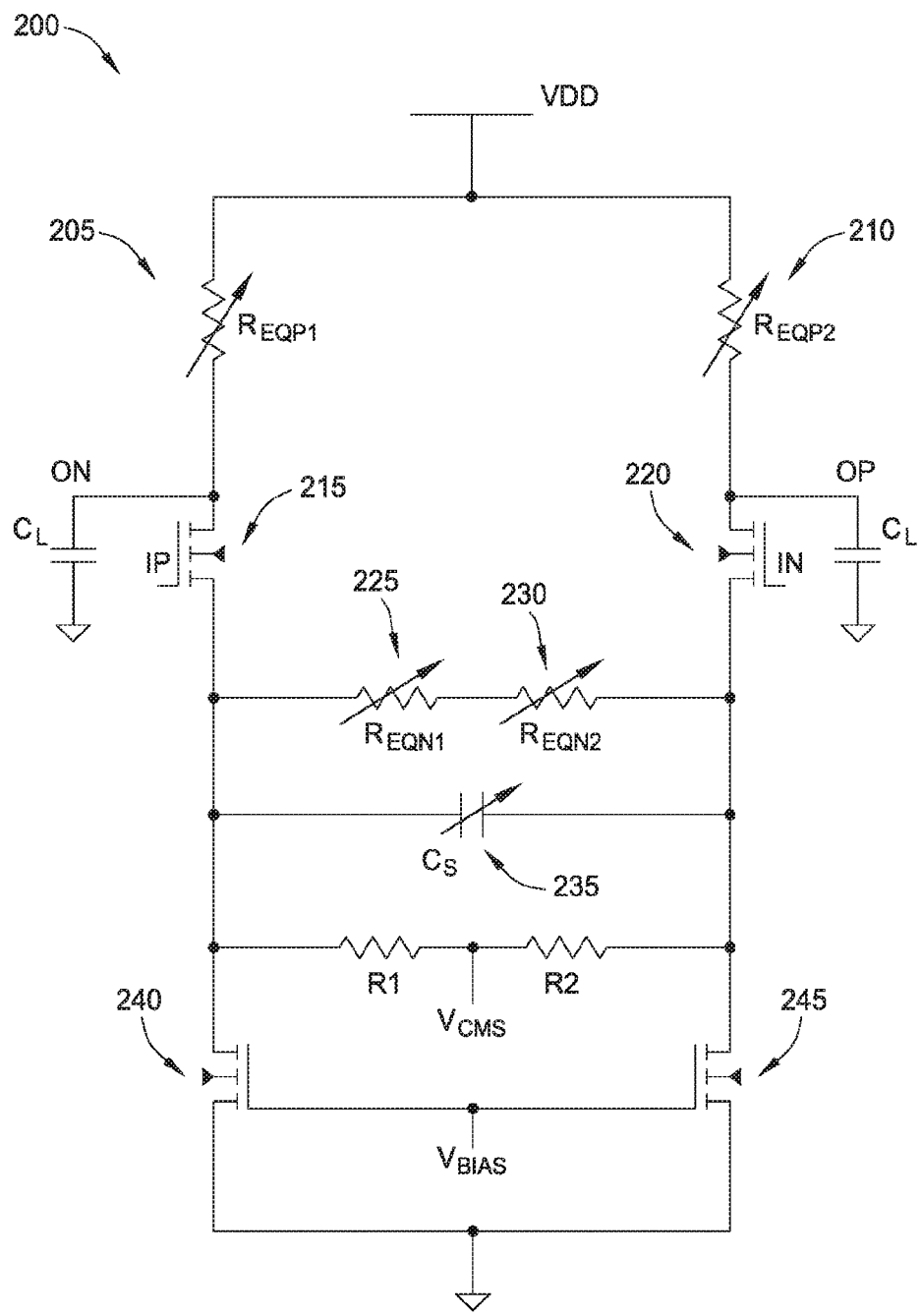
FIG. 2A illustrates a peaking stage in an amplifier in accordance with an embodiment described herein.

FIG. 2A illustrates a peaking stage 200 in an amplifier in accordance with an embodiment described herein. In one embodiment, the circuitry in the peaking stage 200 may be disposed in an integrated circuit that was formed on a wafer. When processing the wafer, hundreds or thousands of the peaking stages 200 may be formed in parallel on the wafer. Once formed, the wafer is cleaved into separate integrated circuits which may include one or more amplifiers that each includes the peaking stage 200. As discussed above, the values of the capacitors and/or resistors in the peaking stage 200 can affect the frequency characteristics of the stage 200 which dictate the gain of the peaking stage 200 across a band of frequencies. However, the peaking stage 200 includes variable resistors 205 and 210 which compensate for fluctuations in the values of the capacitors and/or resistors as a result of process variations when forming the peaking stage 200.

Positive and negative input signals (IP and IN) are received at the gates of a first transistor 215 and a second transistor 220(e.g., an induction channel MOSFETs). As described above, the peaking stage 200 equalizes these signals—i.e., adjusts the distribution of power across the frequencies in the signals for a more even power distribution. Thus, the positive and negative outputs (OP and ON) of the peaking stage 200 have a more even or equal distribution of power across the frequencies relative to the input signals.

The peaking stage 200 also includes variable resistances 225 and 230 that are disposed in series between the first transistor 215 and the second transistor 220. Like the variable resistances 205 and 210, the variable resistances 225 and 230 can be controlled to compensate for capacitance and resistance values that vary depending on process variation. However, in other embodiments, the variable resistances 225 and 230 may be replaced by one or more static (i.e., unchanging) resistors. The peaking stage 200 also includes a variable capacitance 235 and two static resistors R1 and R2 which are in parallel with the variable resistors 225 and 230. The peaking stage 200 can be disabled by disconnecting the variable capacitor 235 from the circuit.

Moreover, the peaking stage 200 includes a third transistor 240 and a fourth transistor 245 whose gates are coupled to a biasing voltage ($V_{BIAS}$) for biasing the peaking stage 200. Moreover, the third transistor 240 and fourth transistor 245 are coupled to a reference voltage—e.g., ground.

Equation 1 defines the gain ($A_0$) of the peaking stage 200, where $R_L$ is the resistance value of one of the variable resistances 205 or 210 and $R_S$ is the resistance value of one of the variable resistances 225 or 230.

$$A_0 = \frac{g_m R_L}{1 + g_m R_S} \quad (1)$$

Equation 2 defines the peaking frequency ($\omega_z$) of the peaking stage 200.

$$\omega_Z = \frac{1}{R_S C_S} \quad (2)$$

Equation 3 defines a first pole frequency ($\omega_{p1}$) of the peaking stage 200.

$$\omega_{p1} = \frac{1 + g_m R_S}{R_S C_S} \quad (3)$$

Equation 4 defines a second pole frequency ($\omega_{p2}$) of the peaking stage 200.

$$\omega_{p2} = \frac{1}{R_L C_L} \qquad (4)$$

The values of the gain ($A_0$) peaking frequency ($\omega_z$), the first pole frequency ($\omega_{p1}$), and the second pole frequency ($\omega_{p2}$) are the frequency characteristics of the peaking stage 200. As shown by Equations 2, 3, and 4, the values of these frequencies depend on the values of $R_S$, $R_L$, $C_S$, and $C_L$. However, because the resistances $R_S$, $R_L$ (i.e., variable resistances 205, 210, 225, and 230) are variable rather than static, the peaking stage 200 can adjust these resistances to compensate for process variations. Put differently, if the variable resistances 205, 210, 225, and 230 where fixed resistances, the values of the frequency characteristics of the peaking stage 200 would vary depending on process variations. However, as described below, the variable resistances 205, 210, 225, and 230 can be adjusted such that the frequency characteristics are invariant to process variations. A process invariant peaking stage is useful for many different applications such as a high-speed SERDES, high-speed display applications for the input device 100, and the like.

Figure 2B:
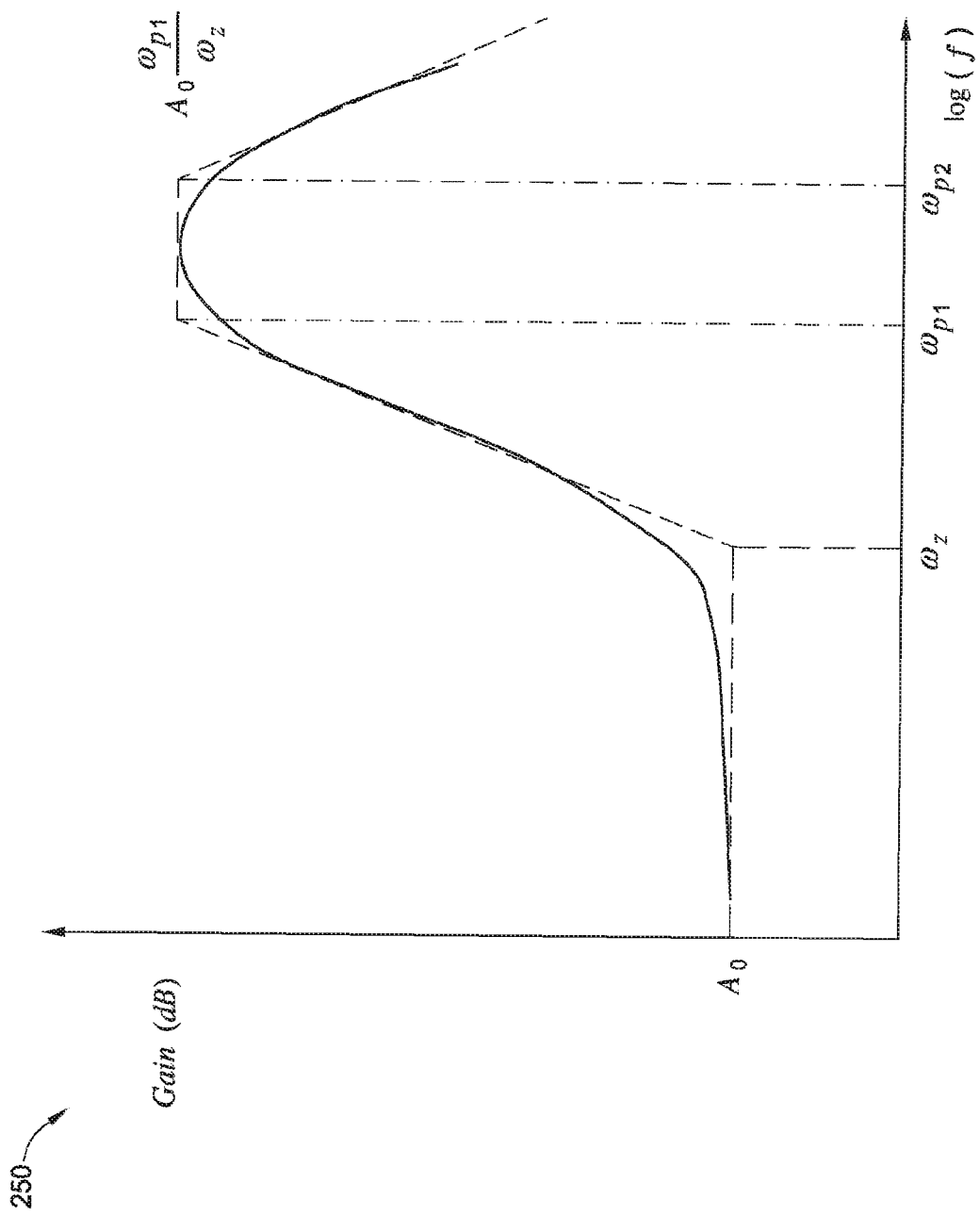
FIG. 2B illustrates a transfer function for the peaking stage in FIG. 2A in accordance with an embodiment described herein.

FIG. 2B is a chart 250 which illustrates a transfer function for the peaking stage in FIG. 2A in accordance with an embodiment described herein. The Y axis of the chart 250 illustrates the gain of the peaking stage while the X axis illustrates the frequency of the signal inputted to the peaking stage. As shown, for frequencies below the peaking frequency ($\omega_z$), the peaking stage operates in a low frequency gain region where the gain is relatively flat (i.e., $A_0$). However, at the peaking frequency, the gain increases until the first pole frequency ($\omega_{p1}$) is reached (also referred to as the saturation frequency). Between the first pole frequency and the second pole frequency ($\omega_{p2}$), the gain of the peaking stage is again relatively flat. The gain of the peaking stage between the first and second pole frequencies can be expressed as:

$$A = A_0 \frac{w_{p1}}{w_z} \qquad (5)$$

After the second pole frequency, the gain of the peaking stage begins to decrease. Using the variable gain shown in chart 250, the peaking stage can equalize power distribution between the frequencies in a signal. For example, if the higher frequencies in a signal (e.g., frequencies between the first and second pole frequencies) have less power than the frequencies below the peaking frequency, inputting this signal into the peaking stage increases the power of the higher frequencies relative to the lower frequencies. As used herein, the terms "equalizer," "equalization," "equalize," or "equalizing" does not mean the peaking stage ensures the power across all frequencies is precisely equal, but rather outputs a signal with improved distribution of the power across its frequencies relative to an input signal.

Figure 3:
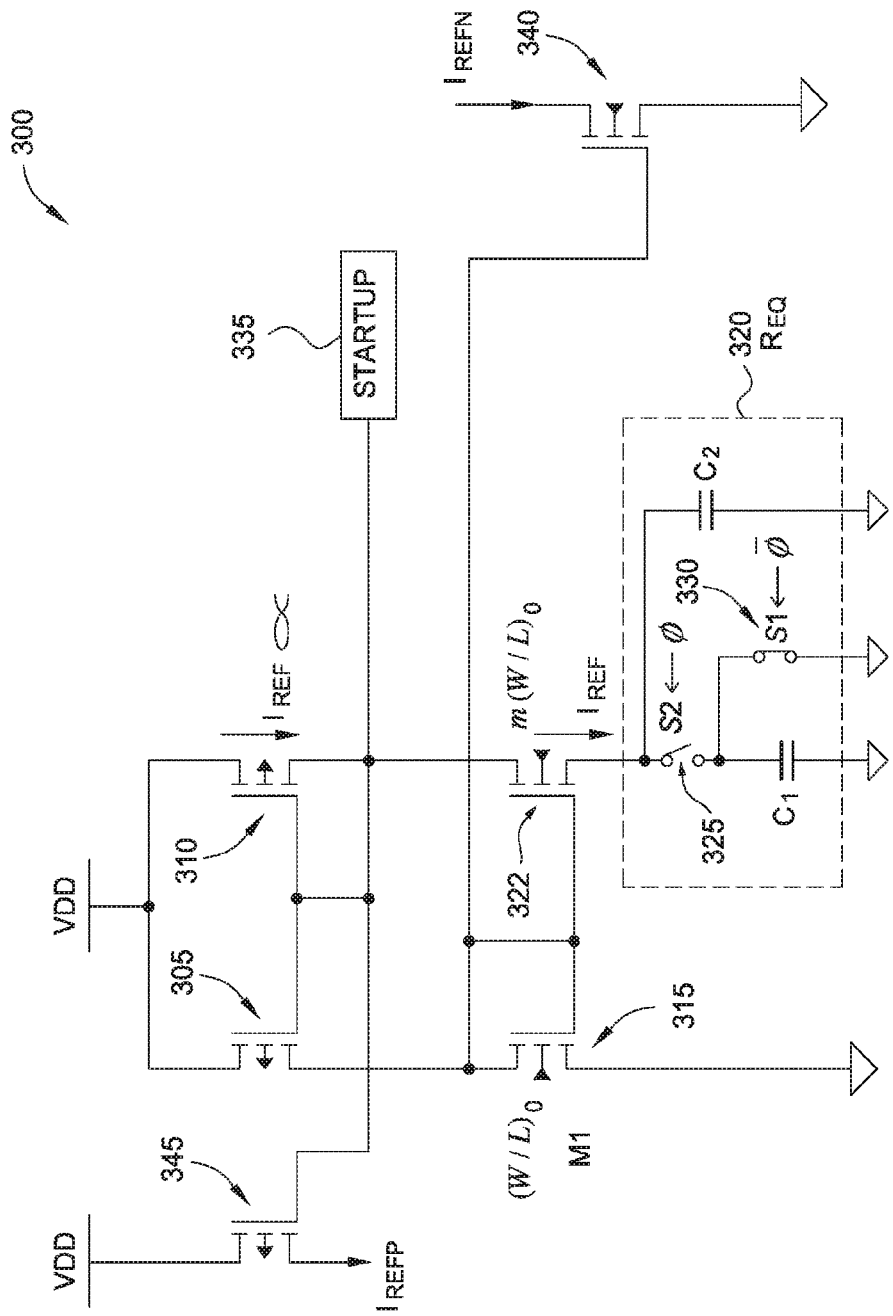
FIG. 3 illustrates a reference current generator for a peaking stage in accordance with an embodiment described herein.

FIG. 3 illustrates a reference current generator 300 for a peaking stage in accordance with an embodiment described herein. In one embodiment, the reference current generator 300 outputs one or more reference currents which are used in other circuits in the peaking stage as described below. The reference current generator 300 includes a first current mirror formed by transistor 305 and 310 and a second current mirror formed by transistors 315 and 322. The drain of transistor 345 generates a positive reference current ($I_{REFP}$) while the drain of transistor 340 generates a negative reference current ($I_{REFN}$). The reference current generator 300 is also coupled to a startup circuit 335 which is used to start the generator 300 when the peaking stage is turned on or initialized to ensure the circuit does not stay in the zero current state, and the startup circuit 335 will shut off itself when the generator 300 is in a normal working state.

The reference current $I_{REF}$ is proportional to the square of the frequency (f) of the clock and the value of capacitor $C_1$ as shown in the following equation:

$$I_{REF} \propto (f^*C_1)^2 \qquad (6)$$

Thus, as the value of the capacitor $C_1$ changes due to a process variation, the reference current also changes.

The source of transistor 322 is coupled to a switched capacitor network that forms an equivalent resistance 320 ($R_{EQ}$). The switched capacitor network includes a switch 325 ($S_2$) and a switch 330 ($S_1$) which are activated based on the clocking values $\varphi$ and $\overline{\varphi}$, where f=frequency($\varphi$). In one embodiment, the switches 325 and 330 are activated using a non-overlapped signal where the switches 325 and 330 are never on at the same time. However, the switches 325 and 330 may both be off at the same time.

When the switch 325 is off (deactivated) and the switch 330 is on (activated) as shown in FIG. 3, the capacitor $C_1$ is discharged. Conversely, when the switch 325 is on and the switch 330 is off, the capacitor $C_1$ is charged in parallel with the capacitor $C_2$. By controlling the switches, the value of the equivalent resistance 320 is proportional to ($f^*C_1$) and the value of the reference current is as follows:

$$I_{REF} = \frac{(fC_1)^2}{\frac{1}{2}\mu C'_{ox}\left(\frac{W}{L}\right)}\left(1 - \frac{1}{\sqrt{m}}\right)^2 \qquad (7)$$

Equation 7 can be simplified using a ratio of constants $B_0$ as:

$$I_{REF} = B_0(fC_1)^2 \propto (fC_1)^2 \qquad (8)$$

Moreover, the gain of the reference current generator 300 is also proportional to the clock frequency and the capacitor $C_1$. As such, these values are dependent on the clock frequency (which is based on a reference clock such as a crystal oscillator) and the value of the capacitor $C_1$ which can vary depending on process variations.

Figure 4:
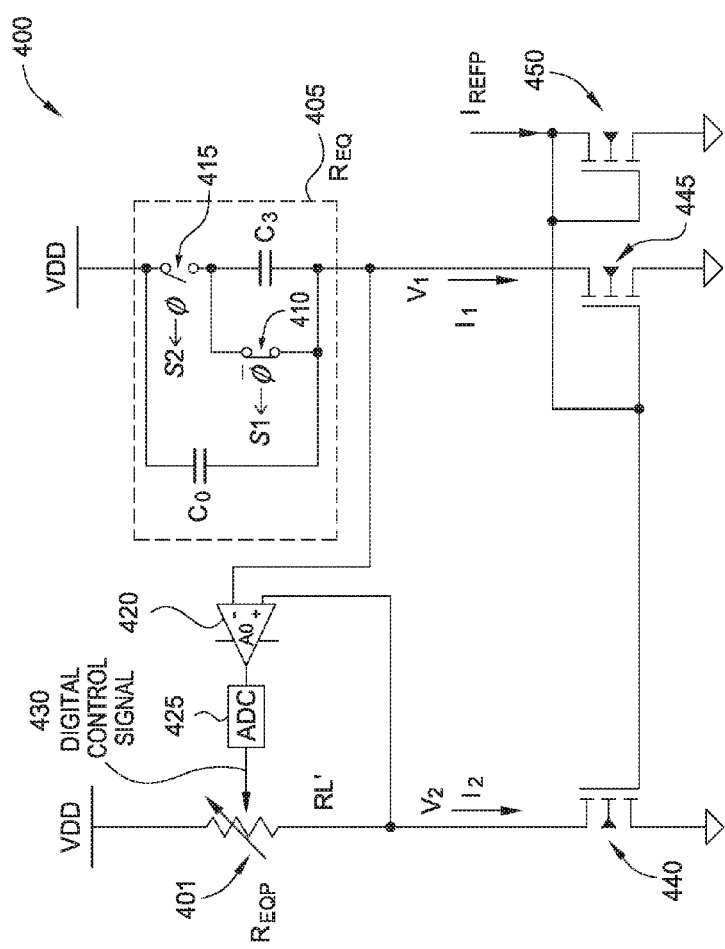
FIG. 4 illustrates a load impedance control generator for a peaking stage in accordance with an embodiment described herein.

FIG. 4 illustrates a load impedance control generator 400 (e.g., a resistance control circuit) for a peaking stage in accordance with an embodiment described herein. As shown, the load impedance control generator 400 uses the positive reference current (i.e., $I_{REFP}$) generated by the reference current generator 300 in FIG. 3 to control the variable resistance 401 ($R_{EQP}$) in the peaking stage. That is, the load impedance control generator 400 generates a digital control signal 430 which adjusts the value of the variable resistance 401. However, as will be described in FIG. 8, the digital control signal 430 can also control the variable resistances 205 and 210 (i.e., $R_{EQP1}$ and $R_{EQP2}$) in the peaking stage shown in FIG. 2.

The load impedance control generator 400 includes a switched capacitor network that forms an equivalent resistance 405 which operates in a similar manner as the switched capacitor network shown in FIG. 3. In one embodiment, the capacitance value of $C_0$ is greater than the value of $C_3$ to keep the voltage ripple at node V1 small. The equivalent resistance 405 includes a first switch 415 and a second switch 410 which, in one embodiment, are driven by non-overlapping signals.

The switched capacitor network outputs a current $I_1$ while the variable resistor 401 outputs the current $1_2$. Both of the currents $I_1$ and $1_2$ are fed into a current mirror formed by transistors 440 and 445. To make these currents equal, the load impedance control generator 400 feeds voltages V1 and V2 into respective inputs of a comparator 420.

The output of the comparator 420 varies according to the difference between the currents $I_1$ and $1_2$. The output of the comparator 420 is coupled to an analog to digital converter (ADC) 425 which generates the digital control signal 430 which varies according to the difference between the currents $I_1$ and $1_2$. Stated generally, the digital control signal 430 adjusts the value of the variable resistance 401 until the currents $I_1$ and $1_2$ are equal. As a result, the resistance values of the variable resistance 401 and the equivalent resistance 405 are equal. Thus, the resistance value of variable resistance 401 can be expressed as:

$$R_{EQP} = \frac{1}{fC_3} \qquad (9)$$

As shown by Equation 9, the value of the variable resistance 401 varies according to the value of the capacitor $C_3$ which can vary in response to process variations and the frequency (f) of the clock.

Figure 5:
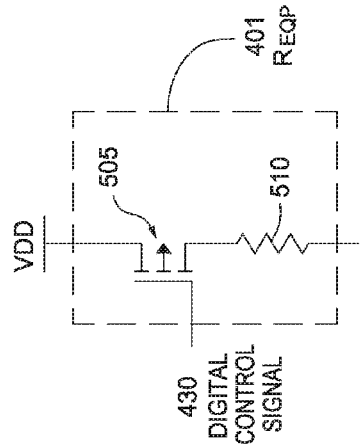
FIG. 5 illustrates a variable resistor for the load impedance control generator in accordance with an embodiment described herein.

FIG. 5 illustrates the variable resistance 401 for the peaking stage 200 in accordance with an embodiment described herein. In one embodiment, the variable resistance 401 receives the digital control signal 430 which activates or deactivates a plurality of transistors 505. Each of the transistors 505 is coupled to a respective fixed, or static, resistor 510. The value of the digital control signal 430 determines the number of the transistors 505 that are activated which combines the resistors 510 in parallel. In this manner, the load impedance control generator can alter the variable resistance 401 in the peaking stage 200 shown in FIG. 2.

In one embodiment, the resistors 510 are poly resistors, and as such, the value of the resistors 510 may change because of process variations. However, because of the feedback loop shown in FIG. 4 where the current (or voltage) of the variable resistance 401 is compared to the current (or voltage) outputted by the equivalent resistance 405, the load impedance control generator 400 can adjust the number of resistors 510 coupled in parallel, thereby changing the total resistance value of the variable resistance 401. Thus, even as the underlying value of the static resistors 510 changes, the load impedance control generator 400 can compensate for these changes using the digital control signals 430.

In one embodiment, the circuit schematic for the variable resistance 401 in the load impedance control generator 400 is also used for the variable resistance 205 and 210 in the peaking stage 200. In one example, the same digital control signal 430 sets the resistance values of the variable resistances 401, 205, and 210 to the same value.

FIG. 6 illustrates a degeneration resistance control generator 600 in accordance with an embodiment described herein. The degeneration resistance control generator 600 is similar to the load impedance control generator 400 shown in FIG. 4. However, the peaking stage uses the degeneration resistance control generator 600 to control the variable resistance 225 and 230 (i.e., $R_{EQN1}$ and $R_{EQN2}$) shown in FIG. 2. To do so, the degeneration resistance control generator 600 uses the negative reference current ($I_{REFN}$), a switched capacitor network (i.e., equivalent resistance 620), a first comparator 605, a second comparator 625, and a ADC 610 to output a digital control signal 615 that varies the resistance of a variable resistance 601. As described below, in one embodiment, the digital control signal 615 also controls the variable resistances 225 and 230 in the peaking stage.

FIG. 7 illustrates the variable resistance 601 for the degeneration resistance control generator 600 in accordance with an embodiment described herein. In one embodiment, the variable resistance 601 receives the digital control signal 615 which activates or deactivates a plurality of transistors 710. Each of the transistors 710 is coupled to a respective fixed or static resistor 705 (e.g., poly resistors). The value of the digital control signal 615 determines the number of the transistors 710 that are activated which combines the resistors 705 in parallel. In this manner, the degeneration resistance control generator can alter the variable resistance 601 in the peaking stage 200 shown in FIG. 2.

In one embodiment, the value of the resistors 705 changes because of process variations used to form the peaking stage. However, because of the feedback loop shown in FIG. 6 where the current (or voltage) of the variable resistance 601 is compared to the current (or voltage) outputted by the equivalent resistance 620, the degeneration resistance control generator 600 can adjust the number of resistors 705 coupled in parallel, thereby changing the total resistance value of the variable resistance 601. Thus, even as the underlying value of the static resistors 705 changes, the degeneration resistance control generator 600 can compensate for these changes using the digital control signals 615.

In one embodiment, the circuit schematic for the variable resistance 601 is also used for the variable resistances 225 and 230 in the peaking stage 200. In one example, the same digital control signal 615 sets the resistance values of the variable resistances 601, 225, and 230 to the same value.

Figure 8:
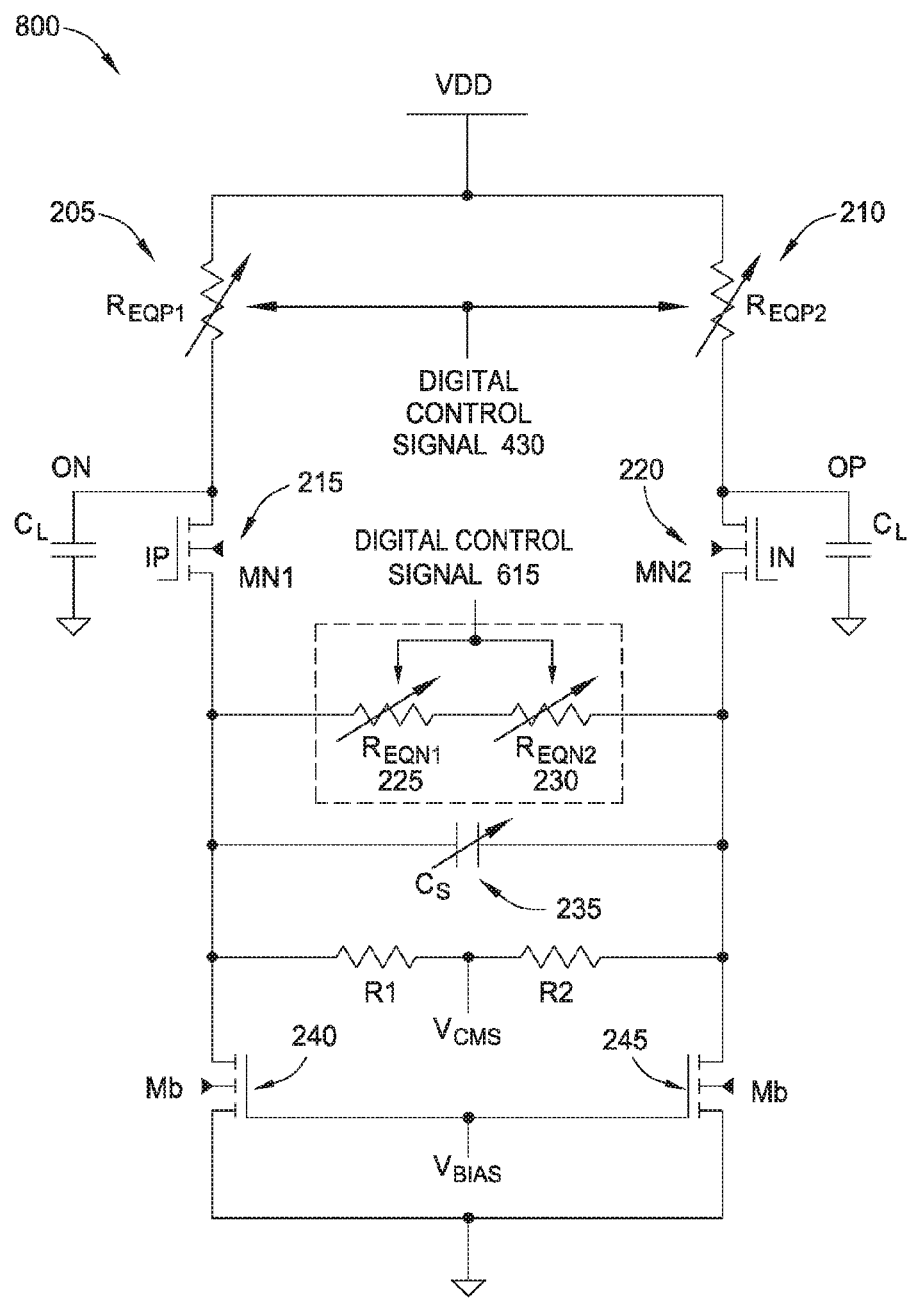
FIG. 8 illustrates a peaking stage for an amplifier in accordance with an embodiment described herein.

FIG. 8 illustrates a peaking stage 800 for an amplifier in accordance with an embodiment described herein. The peaking stage 800 is the same as the peaking stage 200 shown in FIG. 2 except that the peaking stage 800 illustrates the digital control signal 430 outputted by the load impedance control generator and the digital control signal 615 outputted by the degeneration resistance control generator. In one embodiment, the digital control signals 430 adjust the values of the variable resistances 205 and 210 to the same resistance value while the digital control signal 615 adjusts the values of the variable resistances 225 and 230 to the same resistance value. Although respective digital control signals are shown for variable resistance 205 and 210 and for variable resistances 225 and 230, the peaking stage 800 may generate a digital control signal for each of the variable resistances 205, 210, 225, and 230 individually.

The gain of the peaking stage 800 can be expressed as:

$$A_0 = \frac{g_m R_L}{1 + g_m R_S} = \frac{B_1 B_2 (fC_1)(fC_3)^{-1}}{1 + B_1 B_2 (fC_1) B_3 (fC_1)^{-1}} \qquad (11)$$

In Equation 11, the values $B_1$, $B_2$, and $B_3$ represent constant ratios that do not change in response to process variations. Equation 11 can be further reduced as follows:

$$A_0 = \frac{B_1 B_2 B_5}{1 + B_1 B_2 B_3} \qquad (12)$$

As illustrated by Equation 12, the gain of the peaking stage 800 does not depend on the value of the capacitors or resistors in the underlying circuitry. Instead, the gain depends on the value of the constants which do not change depending on process variation. Thus, the peaking stage 800 has a gain which is invariant to process variations.

The peaking frequency of the peaking stage 800 can be expressed as:

$$\omega_Z = \frac{1}{R_S C_S} = \frac{1}{B_3 (fC_1)^{-1} B_4 C_1} = \frac{1}{fB_3 B_4} \quad (13)$$

Like the gain, Equation 13 illustrates that the peaking frequency of the peaking stage 800 is invariant to process variations. Here, the peaking frequency depends on the clock frequency (which depends on a crystal oscillator that generates the clock) and the constant ratios $B_3$ and $B_4$. Thus, as the values of the underlying static resistors and capacitive elements changes, the peaking frequency is unaffected.

The first pole frequency of the peaking stage 800 can be expressed as:

$$\omega_{p1} = \frac{1 + g_m R_S}{R_S C_S} = \frac{1 + B_1 B_2 B_3}{fB_3 B_4} \quad (14)$$

Like the peaking frequency, first pole frequency depends on the clock frequency and the constant B ratios. As such, the first pole frequency is invariant to process variation and is unaffected as the values of the underlying static resistors and capacitive elements changes.

The second pole frequency of the peaking stage 800 can be expressed as:

$$\omega_{p2} = \frac{1}{R_L C_L} = \frac{1}{(fC_3)^{-1} C_L} \quad (15)$$

As shown by Equation 15, the second pole frequency depends on the capacitance $C_3$ and $C_L$ thus may vary depending on process variation. However, the second pole frequency is not as important as the gain, peaking frequency, and the first pole frequency of the peaking stage 800 which are invariant to the processing corner in which the peaking stage 800 was fabricated.

Thus, the embodiments and examples set forth herein were presented in order to best explain the embodiments in accordance with the present technology and its particular application and to thereby enable those skilled in the art to make and use the present technology. However, those skilled in the art will recognize that the foregoing description and examples have been presented for the purposes of illustration and example only. The description as set forth is not intended to be exhaustive or to limit the disclosure to the precise form disclosed.

In view of the foregoing, the scope of the present disclosure is determined by the claims that follow.

We claim:

1. A peaking stage, comprising:
    a first variable resistance comprising a first end coupled to a voltage rail;
    a second variable resistance comprising a first end coupled to the voltage rail;
    a resistance control circuit comprising a first comparator and a first analog to digital converter (ADC) configured to generate a first digital signal for setting a first resistance value of the first variable resistance and a second resistance value of the second variable resistance;
    a first transistor coupled to a second end of the first variable resistance;
    a second transistor coupled to a second end of the second variable resistance, wherein the first and second transistors are configured to generate equalized output signals based on respective input signals; and
    a capacitive switching network comprising a plurality of capacitors and a plurality of switches, wherein the plurality of switches are selectively activated based on a clock signal, wherein an output of the capacitive switching network is coupled to a first input of the first comparator, and
    wherein the second end of the first variable resistance is coupled to a second input of the first comparator.

2. The peaking stage of claim 1, wherein the first variable resistance comprises:
    a plurality of transistors comprising respective gates coupled to the first digital signal; and
    a plurality of resistors respectively coupled to a first end of one of the plurality of transistors, wherein the first digital signal selectively activates the plurality of transistors to change the first resistance value of the first variable resistance.

3. The peaking stage of claim 1, wherein the resistance control circuit comprises:
    a current mirror, wherein the output of the capacitive switching network couples to a third transistor in the current mirror and the second end of the first variable resistance couples to a fourth transistor in the current mirror,
    wherein the first digital signal adjusts the first resistance value of the first variable resistance such that a first current flowing through the third transistor substantially matches a second current flowing through the fourth transistor.

4. The peaking stage of claim 1, further comprising:
    a reference current generator comprising:
        a current mirror, wherein a third transistor in the current mirror is coupled to the capacitive switching network and a fourth transistor in the current mirror is coupled to a reference voltage;
        a fifth transistor coupled to the current mirror, wherein the fifth transistor generates a reference current used by the resistance control circuit to generate the first digital signal.

5. The peaking stage of claim 1, further comprising:
    a third variable resistance coupled to the first transistor; and
    a fourth variable resistance coupled to the second transistor, wherein the third and fourth variable resistances are in series.

6. The peaking stage of claim 5, further comprising:
    a second resistance control circuit comprising a second comparator and a second ADC configured to generate a second digital signal for setting a third resistance value of the third variable resistance and a fourth resistance value of the fourth variable resistance.

7. The peaking stage of claim 5, further comprising:
    a variable capacitor coupled between the first and second transistors, wherein the variable capacitor is coupled in parallel with the third and fourth variable resistances.

8. The peaking stage of claim 5, further comprising:
a third transistor coupled a reference voltage, wherein the third transistor is directly coupled to the first transistor and the third variable resistance; and
a fourth transistor coupled to the reference voltage, wherein the fourth transistor is directly coupled to the second transistor and the fourth variable resistance.

9. An amplifier comprising:
a peaking stage comprising:
a first variable resistance comprising a first end coupled to a voltage rail;
a second variable resistance comprising a first end coupled to the voltage rail;
a third variable resistance coupled to the first transistor;
a fourth variable resistance coupled to the second transistor, wherein the third and fourth variable resistances are in series;
a first resistance control circuit comprising a first comparator configured to generate a first signal for setting a first resistance value of the first variable resistance and a second resistance value of the second variable resistance;
a first transistor coupled to a second end of the first variable resistance; and
a second transistor coupled to a second end of the second variable resistance, wherein the first and second transistors are configured to generate equalized output signals based on respective input signals received by the amplifier.

10. The amplifier of claim 9, wherein the first variable resistance comprises:
a plurality of transistors comprising respective gates coupled to the first signal; and
a plurality of resistors respectively coupled to a first end of one of the plurality of transistors, wherein the first signal selectively activates the plurality of transistors to change the first resistance value of the first variable resistance.

11. The amplifier of claim 9, wherein the first resistance control circuit comprises:
a capacitive switching network comprising a plurality of capacitors and a plurality of switches, wherein the plurality of switches are selectively activated based on a clock signal, and wherein an output of the capacitive switching network is coupled to a first input of the first comparator,
wherein the second end of the first variable resistance is coupled to a second input of the first comparator.

12. The amplifier of claim 11, wherein the first resistance control circuit comprises:
a current mirror, wherein the output of the capacitive switching network couples to a third transistor in the current mirror and the second end of the first variable resistance couples to a fourth transistor in the current mirror,
wherein the first signal adjusts the first resistance value of the first variable resistance such that a first current flowing through the third transistor substantially matches a second current flowing through the fourth transistor.

13. The amplifier of claim 9, wherein the peaking stage comprises:
a second resistance control circuit comprising a second comparator configured to generate a second signal for setting a third resistance value of the third variable resistance and a fourth resistance value of the fourth variable resistance.

14. The amplifier of claim 9, wherein the peaking stage comprises:
a variable capacitor coupled between the first and second transistors, wherein the variable capacitor is coupled in parallel with the third and fourth variable resistances.

15. The amplifier of claim 9, wherein the peaking stage comprises:
a third transistor coupled to a reference voltage, wherein the third transistor is directly coupled to the first transistor and the third variable resistance; and
a fourth transistor coupled to the reference voltage, wherein the fourth transistor is directly coupled to the second transistor and the fourth variable resistance.

16. An integrated circuit, comprising:
a peaking stage comprising:
a first variable resistance comprising: a first end coupled to a voltage rail,
a plurality of transistors, and a plurality of resistors respectively coupled to a first end of one of the plurality of transistors;
a second variable resistance comprising a first end coupled to the voltage rail;
a resistance control circuit comprising a comparator configured to generate a first signal for setting a first resistance value of the first variable resistance and a second resistance value of the second variable resistance, wherein the first signal is coupled to respective gates of the plurality of transistors, and selectively activates the plurality of transistors to change the first resistance value of the first variable resistance;
a first transistor coupled to a second end of the first variable resistance; and
a second transistor coupled to a second end of the second variable resistance, wherein the first and second transistors are configured to generate equalized output signals based on respective input signals.

17. The integrated circuit of claim 16, wherein the resistance control circuit comprises:
a capacitive switching network comprising a plurality of capacitors and a plurality of switches, wherein the plurality of switches are selectively activated based on a clock signal, and wherein an output of the capacitive switching network is coupled to a first input of the comparator,
wherein the second end of the first variable resistance is coupled to a second input of the comparator.

18. A method for generating equalized output signals, the method comprising:
generating a first signal for setting a first resistance value of a first variable resistance having a first end coupled to a voltage rail and a second resistance value of a second variable resistance having a first end coupled to the voltage rail;
selectively activating a plurality of switches of a capacitive switching network having a plurality of capacitors based on a clock signal, wherein an output of the capacitive switching network is coupled to a first input of a first comparator and a second input of the first comparator is coupled to a second end of the first variable resistance; and
generating the equalized output signals from a first transistor coupled to a second end of the first variable resistance and a second transistor coupled to a second end of the second variable resistance based on respective input signals.

19. The method of claim 18 further comprising:
adjusting the first resistance value of the first variable resistance with the first signal such that a first current flowing through a third transistor of a current mirror substantially matches a second current flowing through a fourth transistor of the current mirror.

20. The method of claim 18 further comprising:
generate a second signal for setting a third resistance value of a third variable resistance and a fourth resistance value of a fourth variable resistance.

* * * * *